United States Patent
Coon

(10) Patent No.: US 7,903,233 B2
(45) Date of Patent: Mar. 8, 2011

(54) OFFSET PARTIAL RING SEAL IN IMMERSION LITHOGRAPHIC SYSTEM

(75) Inventor: Derek Coon, Redwood City, CA (US)

(73) Assignee: Nikon Corporation, Tokyo (JP)

( * ) Notice: Subject to any disclaimer, the term of this patent is extended or adjusted under 35 U.S.C. 154(b) by 313 days.

(21) Appl. No.: 11/794,814

(22) PCT Filed: May 18, 2005

(86) PCT No.: PCT/US2005/017160
§ 371 (c)(1), (2), (4) Date: Jul. 6, 2007

(87) PCT Pub. No.: WO2006/078292
PCT Pub. Date: Jul. 27, 2006

(65) Prior Publication Data
US 2008/0094590 A1    Apr. 24, 2008

Related U.S. Application Data

(60) Provisional application No. 60/646,154, filed on Jan. 21, 2005.

(51) Int. Cl.
G03B 27/42 (2006.01)
G03B 27/52 (2006.01)
G03B 27/54 (2006.01)

(52) U.S. Cl. .................. 355/30; 355/53; 355/67
(58) Field of Classification Search .......... 355/30, 355/53, 72, 75
See application file for complete search history.

(56) References Cited

U.S. PATENT DOCUMENTS

| | | | | |
|---|---|---|---|---|
| 3,977,369 A * | 8/1976 | Spark et al. | ................... | 123/242 |
| 4,509,852 A * | 4/1985 | Tabarelli et al. | ................ | 355/30 |
| 6,809,794 B1 * | 10/2004 | Sewell | .............. | 355/30 |
| 2004/0160582 A1 * | 8/2004 | Lof et al. | .......... | 355/30 |
| 2004/0207824 A1 * | 10/2004 | Lof et al. | .......... | 355/30 |
| 2005/0007569 A1 | 1/2005 | Streefkerk et al. | | |
| 2005/0263068 A1 | 12/2005 | Hoogendam et al. | | |
| 2006/0176456 A1 | 8/2006 | Nagasaka et al. | | |

FOREIGN PATENT DOCUMENTS

| EP | 1 646 075 A1 | 4/2006 |
|---|---|---|
| WO | WO 2005/006415 A1 | 1/2005 |

* cited by examiner

*Primary Examiner* — Hung Henry Nguyen
*Assistant Examiner* — Colin Kreutzer
(74) *Attorney, Agent, or Firm* — Oliff & Berridge, PLC

(57) ABSTRACT

A substrate processing apparatus includes a device for partially sealing a gap between a final optical element (22) of a projection lens (14) and an immersion nozzle (20). In one embodiment, the apparatus includes a table configured to support a substrate (16); a patterning element defining a pattern (12); a projection system configured to project the pattern onto the substrate (16), the projection system having a last optical element (22); a gap between the substrate and the last optical element; an immersion element configured to maintain immersion fluid in the gap; and a first seal (102) positioned between the projection system and the immersion element. The first seal (104) is configured to substantially prevent immersion fluid from exiting the space between the projection system and the immersion element.

16 Claims, 4 Drawing Sheets

OFFSET PARTIAL RING SEAL IN IMMERSION LITHOGRAPHIC SYSTEM

CROSS-REFERENCES TO RELATED APPLICATIONS

This application is based on and claims the benefit of U.S. Provisional Patent Application No. 60/646,154, filed Jan. 21, 2005, the entire disclosure of which is incorporated herein by reference.

BACKGROUND OF THE INVENTION

The present invention relates generally to a system and a method for providing fluid for immersion lithography and, more particularly, to offset partial ring seals for partial sealing of a gap between the optical element and the immersion nozzle that provides fluid delivery and recovery for immersion lithography.

An exposure apparatus is one type of precision assembly that is commonly used to transfer images from a reticle onto a semiconductor wafer during semiconductor processing. A typical exposure apparatus includes an illumination source, a reticle stage assembly that retains a reticle, an optical assembly, a wafer stage assembly that retains a semiconductor wafer, a measurement system, and a control system. The resist coated wafer is placed in the path of the radiation emanating from a patterned mask and exposed by the radiation. When the resist is developed, the mask pattern is transferred onto the wafer. In microscopy, extreme ultraviolet (EUV) radiation is transmitted through a thin specimen to a resist covered plate. When the resist is developed, a topographic shape relating to the specimen structure is left.

Immersion lithography is a technique which can enhance the resolution of projection lithography by permitting exposures with numerical aperture (NA) greater than one, which is the theoretical maximum for conventional "dry" systems. By filling the space between the final optical element and the resist-coated target (i.e., wafer), immersion lithography permits exposure with light that would otherwise be totally internally reflected at an optic-air interface. Numerical apertures as high as the index of the immersion liquid (or of the resist or lens material, whichever is least) are possible. Liquid immersion also increases the wafer depth of focus, i.e., the tolerable error in the vertical position of the wafer, by the index of the immersion liquid compared to a dry system with the same numerical aperture. Immersion lithography thus has the potential to provide resolution enhancement equivalent to the shift from 248 to 193 nm. Unlike a shift in the exposure wavelength, however, the adoption of immersion would not require the development of new light sources, optical materials, or coatings, and should allow the use of the same or similar resists as conventional lithography at the same wavelength. In an immersion system where only the final optical element and its housing and the wafer (and perhaps the stage as well) are in contact with the immersion fluid, much of the technology and design developed for conventional tools in areas such as contamination control, carry over directly to immersion lithography.

FIG. 1 shows an immersion lithography system 10 including a reticle stage 12 on which a reticle is supported, a projection lens 14, and a wafer 16 supported on a wafer stage 18. An immersion apparatus 20, which is sometimes referred to herein as a showerhead or a nozzle, is disposed around the final optical element 22 of the projection lens 14 to provide and recover a fluid, which may be a liquid such as water or a gas, between the final optical element 22 and the wafer 16. In specific embodiments, the immersion lithography system 10 includes the reticle and the wafer 16 that are moved synchronously in respective scanning directions during a scanning exposure. One of the challenges of immersion lithography is to design a system for delivery and recovery of a fluid, such as water, between the final optical element and the wafer, so as to provide a stable condition for immersion lithography.

FIG. 2 shows a partial cross-sectional view of a portion of the immersion lithography system 10 illustrating the relationship between the final optical element 22 and the immersion apparatus 20. To avoid transmitting vibration or other disturbances from the immersion apparatus 20 to the projection lens 14, a nozzle gap or spacing 24 is provided between the immersion apparatus 20 and the final optical element 22. During delivery and recovery of the fluid by the immersion apparatus 20 between the final optical element 22 and the wafer 16, and particularly during movement of the wafer stage 18 with respect to the projection lens 14 during scanning, the immersion fluid may escape through the gap 24.

BRIEF SUMMARY OF THE INVENTION

Embodiments of the present invention are directed to a device for partially sealing the nozzle gap between the final optical element of the projection lens and the immersion nozzle. If the nozzle gap were completely sealed, air could be trapped in the nozzle gap and form air bubbles that flow into the exposure region during scanning exposure, which is highly undesirable. A partial sealing of the nozzle gap can impede the flow of the fluid out of the immersion fluid region via the nozzle gap while permitting air to flow out from the nozzle gap, thereby avoiding formation of trapped air bubbles.

An aspect of the present invention is directed to an apparatus, comprising a table configured to support a substrate; a patterning element defining a pattern; a projection system configured to project the pattern onto the substrate, the projection system having a last optical element; a gap between the substrate and the last optical element; an immersion element configured to maintain immersion fluid in the gap; and a first seal positioned between the projection system and the immersion element. The first seal is configured to substantially prevent immersion fluid from exiting the space between the projection system and the immersion element.

In some embodiments, the first seal contains an aperture to allow air to exit the gap. The first seal may be made from a hydrophobic material. The first seal may be circular in shape. A second seal may be positioned between the projection system and the immersion element, the first seal and the second seal being configured to substantially prevent immersion fluid from exiting the space between the projection system and the immersion element. The second seal may have an aperture to allow air to exit the gap. The aperture of the first seal and the aperture of the second seal are offset circumferentially. The aperture of the first seal and the aperture of the second seal may be generally aligned with a scan direction of the substrate. The first seal may be flexible. The first seal may comprise a spiral shaped seal extending more than one revolution around the gap.

In specific embodiments, the immersion element comprises an inner part including a lens opening to accommodate a portion of the lens and position the lens apart from the substrate separated by the space to receive a fluid in the space between the lens and the substrate; and an outer part disposed around the inner part, the outer part including a porous member fluidically coupled with the space and with a fluid recovery outlet to draw fluid from the space via the porous member to the fluid recovery outlet. The inner part is spaced from the outer part by an intermediate spacing. The inner part includes an inner cavity forming a part of the spacing between the lens and the substrate, and the inner part includes apertures disposed above the inner cavity for at least one of introducing fluid into and drawing fluid from the inner cavity. The inner part includes apertures disposed on opposite sides of the lens opening for introducing fluid into the inner cavity. The inner part includes a pair of buffer slots disposed on opposite sides of the lens opening. The inner part includes purge holes and wherein each of the pair of buffer slots is fluidicly coupled to at least one of the purge holes.

In some embodiments, the immersion element comprises a seal element disposed between the last optical element and the substrate, the seal element including a gas seal formed between the seal element and the substrate. The gas seal is disposed in a gas seal region that surrounds a portion of the substrate exposed to the immersion fluid to maintain immersion fluid in the gap. The immersion element comprises a gas inlet to direct a gas into the gas seal region and a gas outlet to provide suction from the gas seal region so as to form the gas seal. The immersion element comprises a gas inlet to direct a gas into the gas seal region and two gas outlets to provide suction from the gas seal region so as to form the gas seal, the two gas outlets being disposed on opposite sides of the gas inlet.

DETAILED DESCRIPTION OF THE INVENTION

Immersion Nozzle

Figure 1:
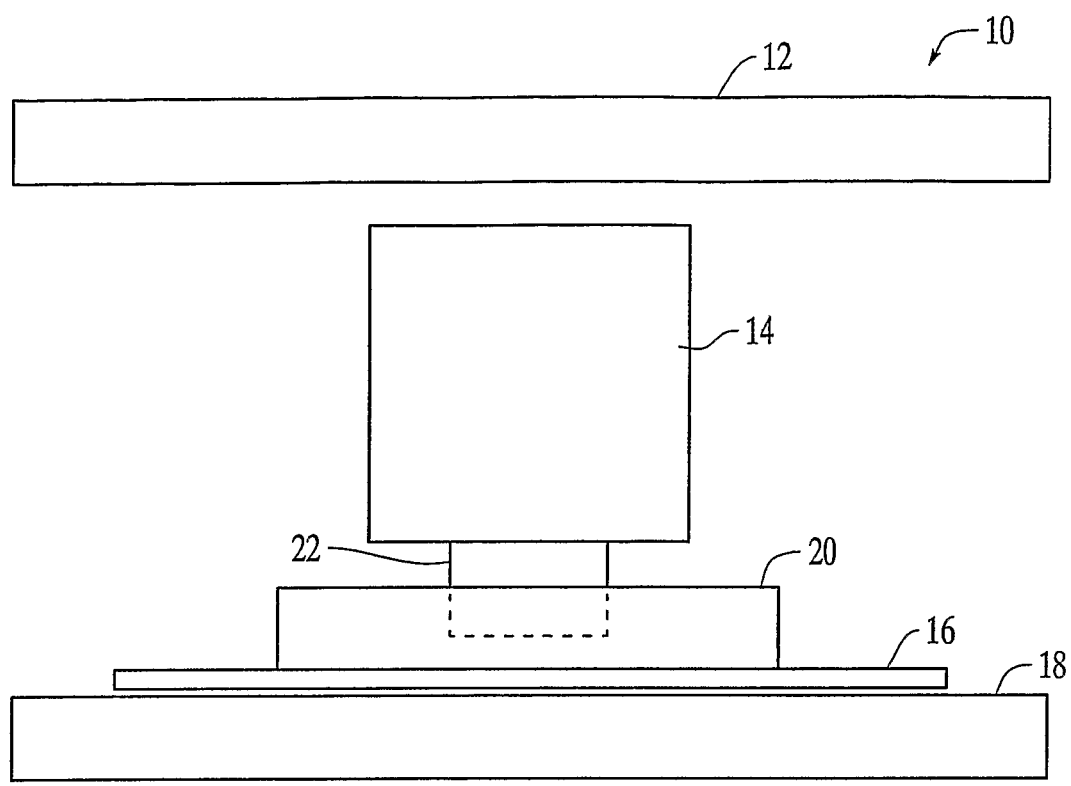
FIG. 1 is a simplified elevational view schematically illustrating an immersion lithography system.
Figure 2:
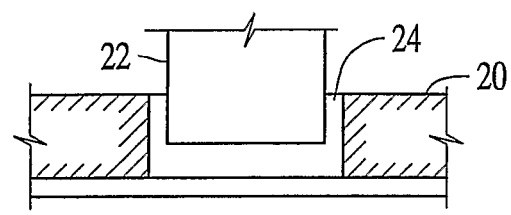
FIG. 2 is a simplified partial cross-sectional view of a portion of the immersion lithography system of FIG. 1.
Figure 3:
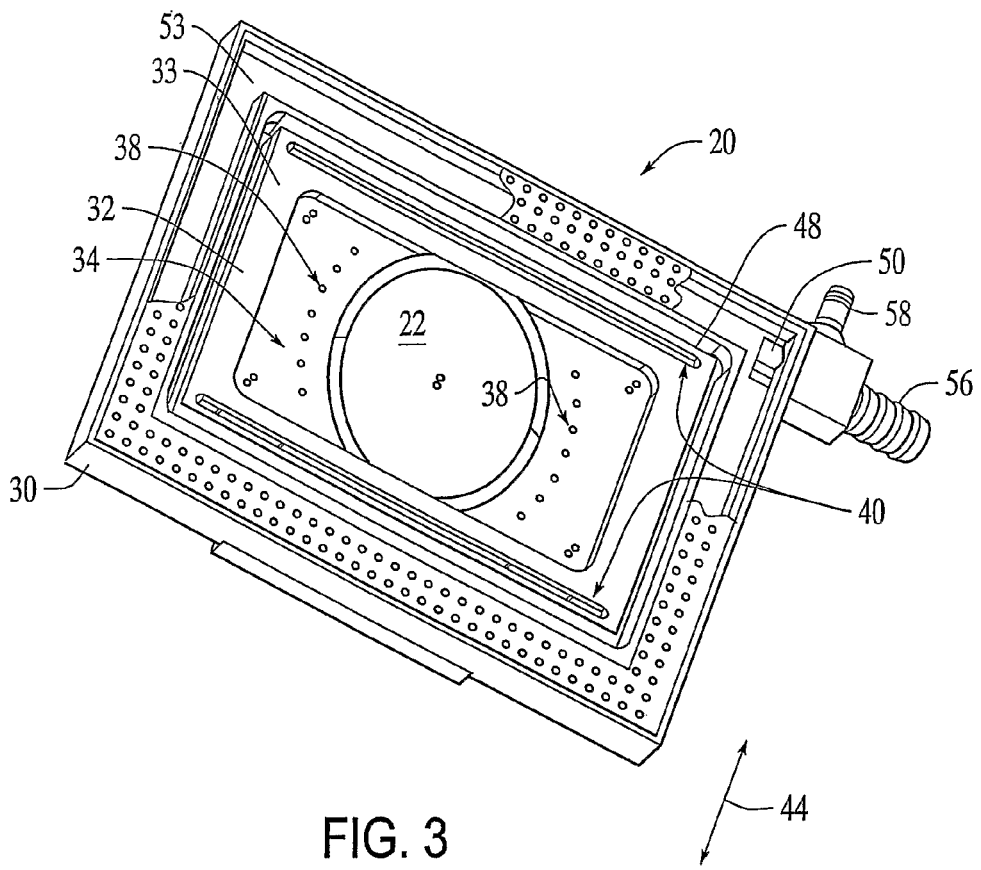
FIG. 3 is a perspective view of a nozzle for fluid delivery and recovery for immersion lithography according to one embodiment of the present invention.
Figure 4:
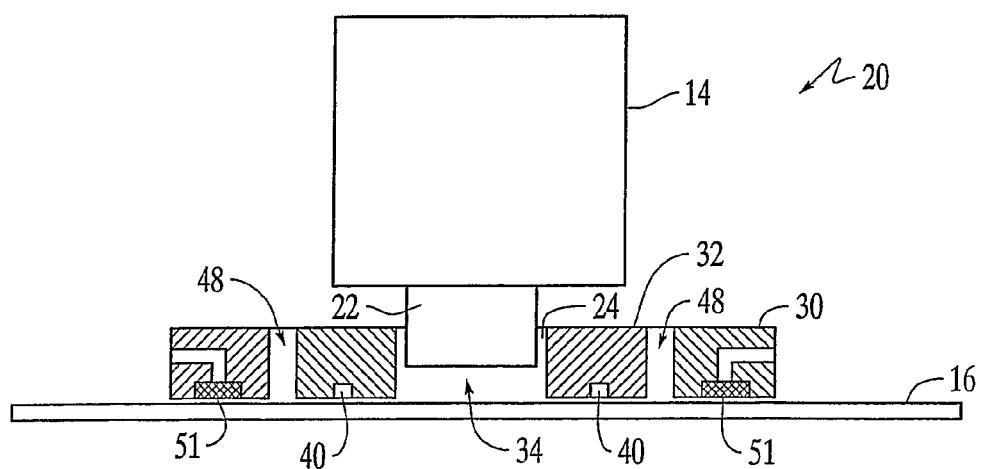
FIG. 4 is a simplified cross-sectional view of the nozzle of FIG. 3.
Figure 5:
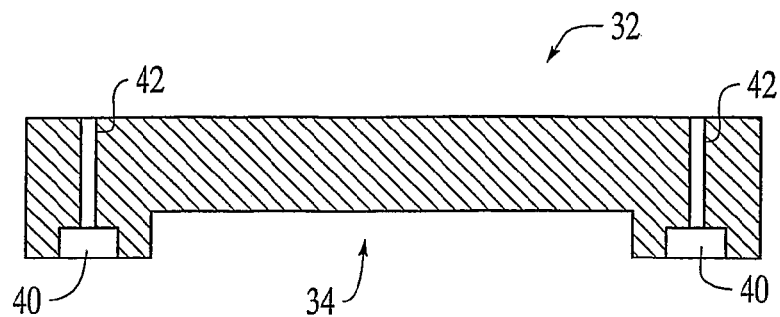
FIG. 5 is a cross-sectional view of the inner part of the nozzle of FIG. 3.

FIGS. 3 and 4 show an example of an apparatus or nozzle 20 for delivery and recovery of the fluid between the final optical element 22 and the wafer 16 for immersion lithography. FIG. 3 shows the bottom perspective view of the nozzle 20, which includes an outer part 30 and an inner part 32. The inner part 32 defines an inner cavity 34 to receive the fluid between the final optical element 22 and the wafer 16. The inner part 32 includes apertures 38 for fluid flow into and out of the inner cavity 34. As seen in FIG. 3, there are apertures 38 disposed on both sides of the final optical element 22. The inner part 32 has a flat portion 33 surrounding the inner cavity 34. The flat portion 33 is substantially parallel to the wafer 16. The distance D1 between the end surface of the final optical element 22 and the wafer 16 is greater than the distance D2 between the flat portion 33 and the wafer 16. The distance D1 could be 1.0-5.0 mm, and the distance D2 could be 0.5-2.0 mm. In another embodiment, the distance D1 is substantially equal to the distance D2. The inner part 32 further includes a pair of buffers or buffer slots 40 with purge holes 42. The buffers 40 are arranged at or near the flat portion 33. The buffers 40 are disposed on opposite sides of the final optical element 22. A cross-sectional view of the inner part 32 in the direction of scan 44 is illustrated in FIG. 5.

The outer part 30 is spaced from the inner part 32 by an intermediate spacing or groove 48, which may be referred to as an atmospheric groove. The outer part 30 includes one or more fluid recovery openings 50 disposed on opposite sides of the final optical element 22. A porous member 51 is disposed in a slot 53 which extends around the inner part 32 and fluidicly communicates with the pair of fluid recovery openings 50. The porous member 51 may be a mesh or may be formed of a porous material having holes typically in the size range of about 50-200 microns. For example, the porous member 51 may be a wire mesh including woven pieces or layers of material made of metal, plastic, or the like, a porous metal, a porous glass, a porous plastic, a porous ceramic, or a sheet of material having chemically etched holes (e.g., by photo-etching). The outer part 30 further includes a fluid buffer outlet 56 and a fluid recovery outlet 58. In the embodiment shown in FIG. 4, the inner part 32 does not contact the final optical element 22, but is spaced from the final optical element 22 by a nozzle gap 24. The gap prevents nozzle vibrations from being transmitted from the nozzle 20 to the final optical element 22.

One feature of the nozzle 20 is that it is made in two pieces, namely, the outer part 30 and the inner part 32. The inner part 32 keeps the fluid between the lens and the wafer surface, and the outer part 30 is mainly provided for fluid recovery. Vibration might be introduced during fluid recovery from the outer part 30 through the porous member 51 to the other components of the lithography system, including the inner part 32 which may be used to direct an autofocus beam to the wafer 16. A damping material can be mounted between the outer part 30 and the mounting piece to which the outer part 30 is mounted to minimize the transmission of vibration from the outer part 30. In addition, the outer part 30 that includes the porous member may be prone to contamination and thus needs to be replaced for maintenance. Making the outer part 30 as a separate part facilitates easier maintenance. It can also minimize readjustment and recalibration time after replacement of the outer part as opposed to replacing the entire nozzle 20. Manufacturability of the nozzle 20 can also be improved if the nozzle 20 is made in two separate parts. It is understood that the nozzle 20 may be made of a single piece in alternative embodiments.

Another feature of the nozzle 20 is the atmospheric groove 48 between the inner part 32 and the outer part 30. This atmospheric groove 48 functions as a breaking edge to prevent fluid in the inner part 30 from being drawn out by the porous member 51 on the outer part 30 if the fluid recovery rate is faster than the fluid supply rate. In the situation when there is no breaking edge, a balance between the fluid recovery rate and the fluid supply rate has to be maintained so that fluid can be kept within the inner part 32 at all times during scanning. Having the atmospheric groove 48 allows the recovery rate to be set at a maximum to minimize fluid leakage out of the outer part 30 during scanning. The atmospheric groove 48 also acts as a buffer for fluid to go in and out during scanning, minimizing water supply and recovery requirements.

In the process of immersion lithography, a fluid is to be filled between the projection lens 14 and the wafer 16 from a dry state and, at other times, the fluid is to be recovered. For example, in the beginning of exposure of a new wafer, the fluid is to completely fill the inner cavity 34 of the inner part 32 before starting exposure. During this process, ideally no air bubbles can exist between the projection lens 14 and wafer 16 or other optical paths such as the auto focus beam. The fluid supply in the inner cavity of the inner part 32 is designed to be at the highest point in the cavity (via apertures 38) so that the fluid is filled from top down, allowing air bubbles to be pushed out of the inner cavity during the filling process. The fluid desirably is initially supplied from one side in this embodiment (the set of apertures 38 on one side), so that the fluid is filled from one side to the other, again allowing air bubbles to be pushed out to avoid trapping air therein. Other arrangements are also possible, as long as the fluid is being filled from the inside out.

On occasion, the fluid has to be fully recovered from the inner cavity of the inner part 32. In FIG. 5, there are small holes 42 in each of the buffers 40 in the inner cavity. These holes 42 are provided for fast fluid recovery or fluid purge when the fluid has to be fully recovered. Sucking the fluid out from these holes 42 using high vacuum with the combination of some movement in the wafer stage 18 allows all the fluid to be recovered within a reasonable time.

The inner part 32 has two groups or rows of holes 38 for supplying or recovering the fluid. Each row can be independently controlled to either supply or recover the fluid. In the case where both rows are chosen for fluid supply, all the fluid is recovered through the porous member 51 in the outer part 30. Since both rows are supplying fluid, a pressure can build up in the inner cavity causing deformation of the final optical element 22 of the projection lens 14 or the wafer 16 or both. The fluid flow across the final optical element 22 may also be limited, and thus the temperature of the fluid between the final optical element 22 and the wafer 16 may eventually rise, causing adverse effect. On the other hand, if one row is chosen for supply and the other for recovery, a fluid flow will be driven across the final optical element 22, minimizing temperature rise. It can also reduce the pressure otherwise created by supplying fluid from both rows. In this case, less fluid needs to be recovered through the porous member 51, lowering the fluid recovery requirement in the porous member. In other nozzle configurations, multiple fluid supplies and recoveries may be provided so as to optimize the performance.

During scanning motion of the wafer stage 18 (in the direction of scan 44 in FIG. 3), the fluid may be dragged in and out of the inner cavity of the inner part 32. When the fluid is dragged out, it is recovered through the porous member 51 in the outer part 30. When the wafer stage 18 is moved in the opposite direction, air may be dragged into the inner cavity of the inner part 32. During this time, the fluid in the buffers 40, as well as the fluid supplied from within the inner cavity, helps to refill the fluid that is dragged along the scanning direction, preventing air from getting into the inner cavity. The buffers 40 and the porous member 51 work together to minimize fluid leaking out from the outer part 30, and air dragging into the inner cavity of the inner part 32 during scanning motion of the wafer stage 18.

Partial Ring Seal

Figure 6:
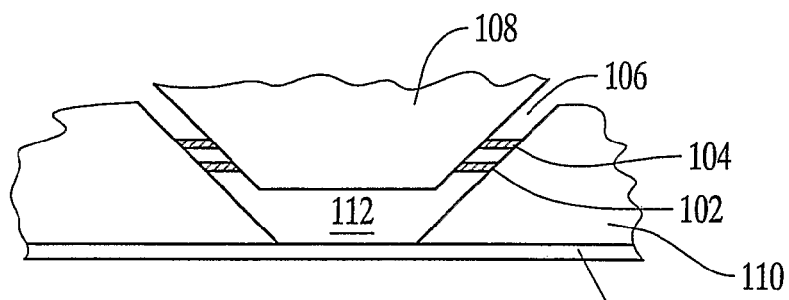
FIG. 6 is a cross-sectional view of a pair of partial ring seals for partially sealing the circumferential gap between an optical element of a projection lens and an immersion nozzle according to an embodiment of the present invention.

FIG. 6 shows a cross-sectional view of a pair of partial ring seals 102, 104 for partially sealing the circumferential gap 106 between an optical element 108 of a projection lens and an immersion nozzle 110 for providing a fluid to an immersion region 112 between the optical element 108 and a wafer 114 for immersion lithography. Although the circumferential gap 106 in FIG. 6 is conical due to the slanted walls of the optical element 108 and nozzle 110, the shape of the circumferential gap may be different in other embodiments.

Figure 7:
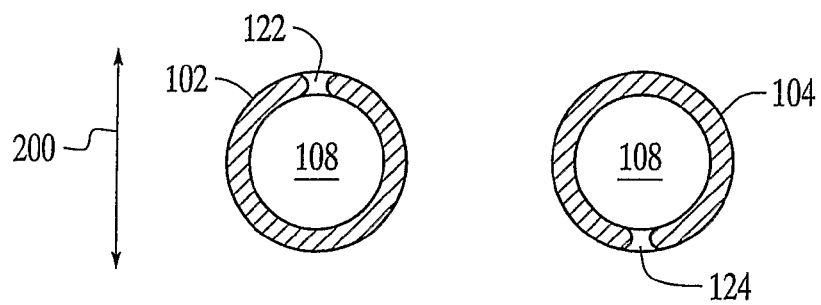
FIG. 7 is a plan view of the pair of partial ring seals of FIG. 6.

As seen in FIG. 7, the first partial ring seal 102 is disposed in the circumferential gap 106 to be in contact with the immersion nozzle 110 and the optical element 108. The first partial ring seal 102 extends generally circumferentially to cover a first sealed portion of the circumferential gap 106 and leaves a first seal opening 122 between the immersion nozzle 110 and the optical element 108. The first seal opening 122 is smaller in area than the first sealed portion of the circumferential gap 106. The second partial ring seal 104 is disposed in the circumferential gap 106 to be in contact with the immersion nozzle 110 and the optical element 108. The second partial ring seal 104 is spaced from the first partial ring seal 102 generally in the axial direction perpendicular to the surface of the wafer 114. The second partial ring seal 104 extends generally circumferentially to cover a second sealed portion of the circumferential gap 106 and leaves a second seal opening 124 between the immersion nozzle 110 and the optical element 108. The second seal opening 124 is smaller in area than the second sealed portion of the circumferential gap 106. Preferably, the first seal opening 122 is substantially smaller in area than the first sealed portion of the circumferential gap 106, and the second seal opening 124 is substantially smaller in area than the second sealed portion of the circumferential gap 106 (for example, less than about 10% in area). The first seal opening 122 and the second seal opening 124 are offset circumferentially with respect to each other. In FIG. 7, they are offset circumferentially with respect to each other by about 180° (which is the maximum offset). In that case, the first seal opening 122 and the second seal opening 124 may be generally aligned with a scan direction 200 of the wafer 114 during lithography. In other embodiments, the offset angle may vary (e.g., 150°, 90°, 60°, etc.), but is preferably greater than about 30°.

In FIG. 7, the first partial ring seal 102 includes two ends which are separated and spaced from one another to form the first seal opening 122, and the second partial ring seal 104 includes two ends which are separated and spaced from one another to form the second seal opening 124. For example, the two ends of the first partial ring seal 102 are separated from one another by about 0.5-3 mm, and the two ends of the second partial ring seal 104 are separated from one another by about 0.5-3 mm. In alternative embodiments, the two ends of each partial ring seal may be connected by a thin portion and still leave a seal opening for fluid to pass therethrough.

In the embodiment of FIGS. 6 and 7, the first partial ring seal 102 and the second partial ring seal 104 are generally circular and configured to be spaced from each other generally in the axial direction. The spacing between the two partial ring seals 102, 104 may be uniform or nonuniform.

The first partial ring seal 102 and the second partial ring seal 104 are desirably flexible to form deformable sealing members. The first partial ring seal 102 and the second partial ring seal 104 may each comprise a foam material or a soft plastic material. A typical soft plastic material has a durometer of about 40 or lower. The first partial ring seal 102 and the second partial ring seal 104 each desirably include a surface or a coating material which is hydrophobic to a fluid to be provided to the immersion region 112 between the optical element 108 and the wafer 114 for immersion lithography. The fluid tends to bead up in the presence of the hydrophobic coating, having a contact angle of greater than about 90°. For water as the immersion fluid or other fluids having comparable characteristics, PolyTetraFluoroEthylene (PTFE) is a suitable hydrophobic coating material. The material of the sealing device should be clean room compatible.

In the embodiment shown in FIGS. 6 and 7, the partial sealing device comprising the two partial ring seals 102, 104 provides a partially blocked flow path in the circumferential gap 106 between the immersion region 112 and an external region which is external to the immersion region 112 and the circumferential gap 106. The partially blocked flow path is substantially longer than an unblocked flow path between the immersion region 112 and the external region without the partial sealing device. The flow path is longest when the first seal opening 122 and the second seal opening 124 are circumferentially offset by about 180°. Of course, additional partial ring seals can be added to further lengthen the flow path.

Figure 8:
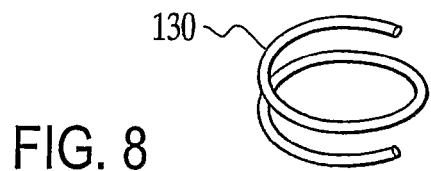
FIG. 8 shows a spiral shaped seal which extends more than one revolution around the circumferential gap according to another embodiment of the present invention.

Other partial sealing devices may also produce a substantially longer flow path between the immersion region 112 and the external region. For example, FIG. 8 shows a spiral shaped seal 130 which extends more than one revolution around the circumferential gap 106. The higher the number of revolutions the spiral shaped seal extends in the circumferential gap 106, the longer the flow path. More than one spiral shaped seal 130 may be used.

Another Embodiment

Figure 9:
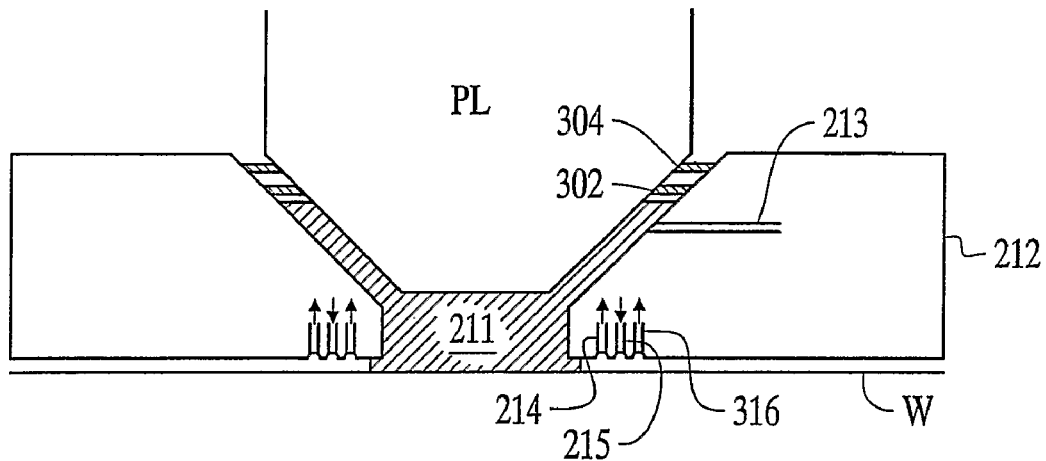
FIG. 9 is a schematic view of a liquid reservoir for an immersion element according to another embodiment of the invention.

FIG. 9 shows another embodiment of the immersion lithography apparatus employing an air curtain or gas seal. A liquid reservoir is disposed between the projection system PL and the substrate W. The liquid reservoir is filled with a liquid 211. The reservoir 10 forms a contactless seal to the substrate around the image field of the projection system so that liquid is confined to fill a space between the substrate surface and a final element of the projection system. The reservoir is formed by a seal member 212 positioned below and surrounding the final element of the projection system PL. Liquid is brought into the space below the projection system and within the seal member 212. The seal member 212 preferably extends a little above the final element of the projection system and the liquid level rises above the final element so that a buffer of liquid is provided. The seal member 212 has an inner periphery that at the upper end closely conforms to the step of the projection system or the final element thereof and may be round, for example. At the bottom, the inner periphery closely conforms to the shape of the image field, for example, rectangular, or other shapes.

The liquid is confined in the reservoir by a gas seal 216 between the bottom of the seal member 212 and the surface of the substrate W. The gas seal is formed by gas provided under pressure via an inlet 215 to the gap between the seal member 212 and the substrate W and extracted via a first outlet 214. The overpressure on the gas inlet 215, vacuum level on the first outlet 214, and geometry of the gap are arranged so that there is a high-velocity gas flow inwards that confines the liquid.

Figure 10:
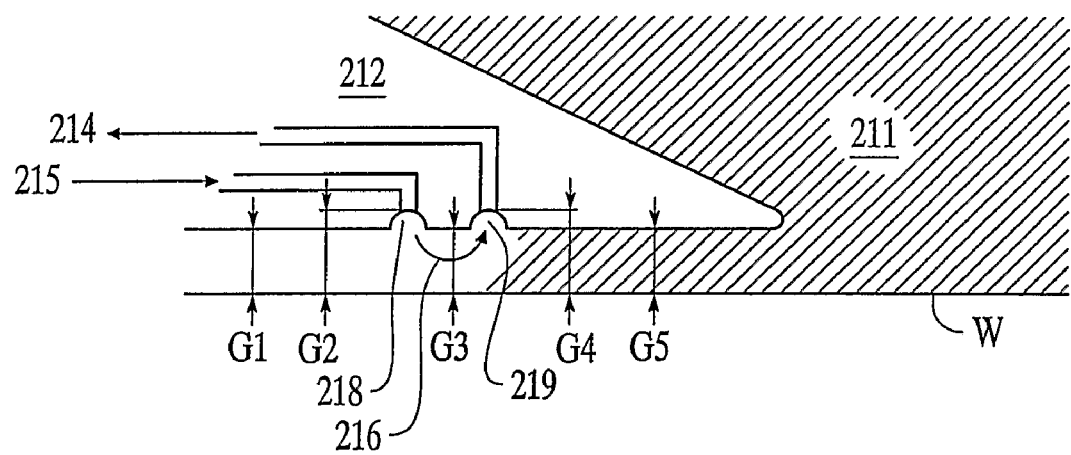
FIG. 10 is an enlarged view of a part of the liquid reservoir of the immersion element of FIG. 9.

As seen in FIG. 10, the gas seal is formed by two annular grooves 218, 219 which are connected to the first inlet 215 and the first outlet 214, respectively, by a series of small conduits spaced around the grooves. A large annular hollow in the seal member 212 may be provided in each of the inlet 215 and the outlet 214 to form a manifold. The gas seal 216 may also be effective to support the seal member 212 by behaving as a gas bearing.

A gap G1, on the outer side of the gas inlet 215, may be small and long so as to provide resistance to air flow outwards. A gap G2, at the radius of the inlet 215, is a little larger to ensure a sufficient distribution of gas around the seal member 212, the inlet 215 being formed by a number of small holes around the seal member 212. A gap G3 is chosen to control the gas flow through the seal member 212. A gap G4 is larger to provide a good distribution of vacuum, the outlet 214 being formed of a number of small holes in the same manner as the inlet 215. A gap G5 is small to prevent gas/oxygen diffusion into the liquid in the space, to prevent a large volume of liquid entering and disturbing the vacuum and to ensure that capillary action will always fill it with liquid. The gas seal 216 is thus a balance between the capillary forces pulling liquid into the gap and the airflow pushing liquid out. As the gap widens from G5 to G4, the capillary forces decrease and the airflow increases so that the liquid boundary will lie in this region and be stable even as the substrate moves under the projection system PL.

The pressure difference between the inlet 215 at G2 and the outlet 214 at G4, as well as the size and geometry of gap G3, determine the gas flow through the gas seal 216 and will be determined according to the specific embodiment. However, if the length of gap G3 is short and absolute pressure at G2 is twice that at G4, the gas velocity will be the speed of sound in the gas and cannot rise any higher. A stable gas flow will therefore be achieved.

The gas outlet system can also be used to completely remove the liquid from the system by reducing the gas inlet pressure and allowing the liquid to enter gap G4 and be sucked out by a vacuum system, which can easily be arranged to handle the liquid, as well as the gas used to form the seal. Control of the pressure in the gas seal can also be used to ensure a flow of liquid through gap G5 so that liquid in this gap that is heated by friction as the substrate moves does not disturb the temperature of the liquid in the space below the projection system.

The shape of the seal member 212 around the gas inlet 215 and outlet 214 should be chosen to provide laminar flow as far as possible so as to reduce turbulence and vibration. Also, the gas flow should be arranged so that the change in flow direction at the liquid interface is as large as possible to provide maximum force confining the liquid. The liquid supply system circulates liquid in the reservoir so that fresh liquid is provided to the reservoir.

The gas seal 216 can produce a force large enough to support the seal member 212. Indeed, it may be possible to bias the seal member 212 towards the substrate to make the effective weight supported by the seal member 212 higher. The seal member 212 will in any case be held in the XY plane (perpendicular to the optical axis) in a substantially stationary position relative to and under the projection system but decoupled from the projection system. The seal member 212 is free to move in the Z direction and can therefore move to accommodate changes in the surface height of the substrate.

When the substrate W is being moved, shearing forces will try to move the penetration level of the liquid in the gap between the liquid supply system and the substrate either to the outside or to the inside (left or right as illustrated). Both are unwanted, to the outside may lead to leakage, and to the inside may lead to air bubbles in the liquid. This can also happen as the height of the liquid supply system varies. One way to keep the liquid meniscus in a constant position is to monitor and actively control the position of liquid under the liquid supply system. The control may be implemented by locally increasing and decreasing the air and vacuum pressures in the gas seal 216.

As seen in FIG. 9, a second gas outlet 316 is provided on the opposite side of the gas inlet 215 to the first gas outlet 214. In this way any gas escaping from the gas inlet 215 outwards away from the optical axis of the apparatus is sucked up by second gas outlet 316 which is connected to a vacuum source. In this way gas is prevented from escaping from the gas seal so that it cannot interfere, for example, with interferometer readings or with a vacuum in which the projection system and/or substrate are housed.

One or more partial ring seals may be used to partially seal the circumferential gap between the final optical element of the projection lens PL and the sealing member 212. FIG. 9 shows two partial ring seals 302, 304. The structure and orientation of the partial ring seals 302, 304 may be similar to those of the partial ring seals 102, 104 in FIGS. 6 and 7. In addition, one or more spiral shaped seals similar to the spiral shaped seal 130 in FIG. 8 may be used. Because these similar seals have been described in connection with FIGS. 6-8 above, the description is not repeated here.

It is to be understood that the above description is intended to be illustrative and not restrictive. Many embodiments will be apparent to those of skill in the art upon reviewing the above description. The scope of the invention, therefore, is not limited to the above description.

What is claimed is:

1. An apparatus comprising:
    a table by which a substrate is supported;
    a projection system configured to project a pattern onto the substrate, the projection system having a last optical element;
    an immersion element which maintains immersion liquid in a space between the substrate and the last optical element;
    a first seal positioned between the projection system and the immersion element, the first seal being arranged to substantially prevent flow of the immersion liquid through a gap between the projection system and the immersion element and to permit flow of a gas through the gap; and
    a second seal positioned between the projection system and the immersion element, the second seal being arranged to substantially prevent the flow of the immersion liquid through the gap and to permit the flow of the gas through the gap, wherein
    the first and second seal each are solid members;
    the first seal is arranged such that a first aperture is formed to allow the flow of the gas through the gap,
    the second seal is arranged such that a second aperture is formed to allow the flow of the gas through the gap, and
    the first aperture and the second aperture are offset circumferentially.

2. The apparatus of claim 1, wherein the first seal is made from a hydrophobic material.

3. The apparatus of claim 1, wherein the first seal is circular in shape.

4. The apparatus of claim 1, wherein the first aperture and the second aperture are generally aligned with a scan direction of the substrate.

5. The apparatus of claim 1, wherein the first seal is flexible.

6. The apparatus of claim 1, wherein the first seal comprises a spiral shaped seal extending more than one revolution around the gap.

7. The apparatus of claim 1, wherein the immersion element comprises:
    an inner part including a lens opening to accommodate a portion of the lens; and
    an outer part disposed around the inner part, the outer part including a porous member fluidicly coupled with the space to draw the immersion liquid from the space via the porous member.

8. The apparatus of claim 7, wherein the inner part is spaced from the outer part by an intermediate spacing.

9. The apparatus of claim 7, wherein the inner part includes an inner cavity forming a part of the space between the lens and the substrate, and wherein the inner part includes apertures disposed above the inner cavity for at least one of introducing liquid into and drawing liquid from the inner cavity.

10. The apparatus of claim 9, wherein the inner part includes apertures disposed on opposite sides of the lens opening for introducing liquid into the inner cavity.

11. The apparatus of claim 7, wherein the inner part includes a pair of buffer slots disposed on opposite sides of the lens opening.

12. The apparatus of claim 11, wherein the inner part includes purge holes and wherein each of the pair of buffer slots is fluidicly coupled to at least one of the purge holes.

13. The apparatus of claim 1, wherein the immersion element comprises a seal element, the seal element including a gas seal formed between the seal element and the substrate.

14. The apparatus of claim 13, wherein the gas seal is disposed in a gas seal region that surrounds a portion of the substrate exposed to the immersion liquid to maintain immersion liquid in the gap.

15. The apparatus of claim 14, wherein the immersion element comprises a gas inlet to direct a gas into the gas seal region and a gas outlet to provide suction from the gas seal region so as to form the gas seal.

16. The apparatus of claim 14; wherein the immersion element comprises a gas inlet to direct a gas into the gas seal region and two gas outlets to provide suction from the gas seal region so as to form the gas seal, the two gas outlets being disposed on opposite sides of the gas inlet.

* * * * *